United States Patent [19] | [11] 3,760,288
Leonard | [45] Sept. 18, 1973

[54] OPERATIONAL AMPLIFIER

[75] Inventor: Paul L. Leonard, Torrance, Calif.

[73] Assignee: TRW Inc., Los Angeles, Calif.

[22] Filed: Aug. 9, 1971

[21] Appl. No.: 170,210

[52] U.S. Cl. .................... 330/30 D, 330/13, 330/17, 330/38 M

[51] Int. Cl. .................... H03f 3/68

[58] Field of Search ............ 330/38 M, 38 R, 30 D, 330/30 R, 13, 18, 17

[56] References Cited

UNITED STATES PATENTS

| | | | |
|---|---|---|---|
| 3,684,973 | 8/1972 | Duck | 330/30 D |
| 3,697,882 | 10/1972 | Van Den Plassche | 330/15 |
| 3,416,092 | 12/1968 | Frederiksen | 330/38 M X |
| 3,538,449 | 11/1970 | Solomon | 330/30 D |
| 3,611,170 | 10/1971 | Wheatley | 330/38 M X |

OTHER PUBLICATIONS

Buckley, "Differential Input Stage," IBM Technical Disclosure Bulletin, Vol. 12, No. 5, October 1969, p. 667, 668.

*Primary Examiner*—Roy Lake
*Assistant Examiner*—James B. Mullins
*Attorney*—Spensley, Horn and Lubitz

[57] ABSTRACT

An operational amplifier having a broad bandwidth, very low power consumption and an externally variable bias current which adjusts the bias of various stages of the amplifier. The externally adjustable bias allows the adjustment of bias for various supply voltages and operating conditions and allows the operation of the amplifier on supply voltages as low as plus or minus one volt with a power dissipation as low as 60 microwatts. Active loads are used for each stage of the amplifier and the broadband capability of the amplifier is obtained by relatively low reflected resistances which determine the time constant of certain of the stages in the amplifier. In an integrated circuit configuration, improved stability and common mode rejection are achieved by forming a plurality of transistors in a common base pocket.

10 Claims, 13 Drawing Figures

PAUL L. LEONARD
INVENTOR.

BY Spensley, Horn & Lubitz
ATTORNEYS

Patented Sept. 18, 1973 3,760,288

2 Sheets-Sheet 2

PAUL L. LEONARD
INVENTOR.

BY Spensley, Horn & Lubitz
ATTORNEYS

OPERATIONAL AMPLIFIER

BACKGROUND OF THE INVENTION

1. Field of the Invention

This invention relates to the field of operational amplifiers.

2. Prior Art

Operational amplifiers, because of their flexibility and adaptability to a multitude of uses, have been used for a number of years as the basic building block in electronic systems, and particularly in linear systems. The earlier operational amplifiers were fabricated using discrete components and were relatively large and expensive. In recent years, operational amplifiers in the form of integrated circuits have replaced the amplifiers fabricated of discrete components and are now available in a large variety and at a relatively low cost. Since the preferred embodiment of the operational amplifier of the present invention is fabricated in integrated circuit form, and since by far the largest application for operational amplifiers is for integrated circuit amplifiers, the following discussion of prior art shall be limited to prior art integrated circuit operational amplifiers.

Prior art operational amplifiers are generally of two basic configurations. The first configuration uses passive loads for each stage of the amplifier. The second configuration uses active loads to stablize the currents in the various stages and to provide the higher gain characteristic of such a configuration.

The original integrated circuit operational amplifiers generally used passive loading for all stages of the amplifier, the resistors providing the passive loading being formed either by patterns of resistive thin-film material on the surface of the substrate or by using the bulk resistivity of one of the diffused areas in the substrate. Because it is difficult to achieve close control of absolute resistor values, but relatively easy to achieve close control of resistance ratios, circuits having a performance dependent upon resistance ratios rather than absolute value of resistances are generally used.

While the circuits utilizing passive loading may vary considerably, all such circuits have certain characteristics which limit the flexibility of the circuit. The greatest limitation arises from the fact that the operating points for all stages of the amplifier are determined by the values of the resistors and the power supply voltages used. Consequently, for any given amplifier, proper operation of that amplifier may only be achieved if the power supply voltages are limited to within a reasonable range about the design supply voltages. Also, the use of resistive loading has a net effect of dividing down the gain achieved in the amplifying stages. The net effect is either a reduction in overall gain for the amplifier or, conversely, the requirement for an increase in the gain of the transistors used or the provision of an additional stage of amplification to make up for this loss in gain.

Though some prior art amplifiers use active loads for the various amplifier stages therein, they also have certain limitations. The bias or operating point for the active loads is always determined internally to the amplifier. This tends to limit the power supply voltage range that may be used with a given amplifier and also prevents setting the bias current for any and all stages based on the output current requirements for the particular loads on the amplifier. Consequently, the power supply voltage requirements for such amplifiers is commonly relatively high and the power dissipation is substantial because of setting the bias current at a relatively high value.

Also, prior art amplifiers using active loads have characteristically used high gain coupling transistors, which, because of the effective reflected base resistance in combination with the collector-to-base capacitance of such transistors, results in a relatively long time constant for the coupling stage. Consequently, the bandwidth, and particularly the open loop bandwidth, of such amplifiers is commonly very low, a reasonable bandwidth being obtained only at the expense of gain by putting considerable feedback around the amplifier.

In amplifiers having either passive loading or active loading, the operating point for the various stages of the amplifier is inherently determined within the amplifier itself. Though such amplifiers could be designed to operate under such conditions as lower power supply voltage and power consumption, such an amplifier would be strictly limited to such use, and because of such limitations, is not an attractive commercial product. In that regard, it should be noted that a family of amplifiers differing only in the internally determined biases for use in different applications is not a commercially attractive product line because of the development and expense associated with making any change in the circuit values of an integrated circuit device.

BRIEF SUMMARY OF THE INVENTION

An operational amplifier having a broad bandwidth, very low power consumption, and an externally variable bias current which adjusts the bias of various stages of the amplifier. The amplifier utilizes active loads for the various stages therein, with the bias current on the input and the coupling stages being adjusted simultaneously through an external resistance connected between a bias terminal and the positive side of the power supply. The bias current through this external resistor is applied to a common base-collector connection on the bias current determining transistor. The diode voltage-current characteristic curve of the bias current determining transistor establishes the base to emitter voltage in other similar transistors, which in turn determines the bias current in the differential input and the coupling stage of the amplifier. By appropriate selection of the external bias resistor, the amplifier may be used with various power supply voltages to provide various output voltage swing and power capabilities, and is capable of operation with a power supply having a voltage level as low as ± 1 volt with a power dissipation as low as 60 microwatts.

In order to achieve a wide bandwidth, a coupling transistor having a moderate current gain (30—50) is used between the differential input stage and the output stages of the amplifier. This provides a relatively low effective load resistance for the coupling transistor which, in combination with the capacitances inherent in such a device, results in a reduced RC time constant for the coupling therein.

The bias stability and common mode rejection of the amplifier is dependent upon the accurate matching of the transistors and, in particular, two transistors on the differential input of the amplifier. To improve the matching of these transistors, which in the amplifier circuit have a common base connection, these two transistors, and in the preferred embodiment, a third transistor also, are formed in an isolated area of the semiconductor substrate with the substrate area serving as a base region common to the three transistors. This provides the common base connection and allows the physical placement of the transistors as close together as possible so as to insure a minimum temperature difference between the transistors, both during the diffusion processes and in operation, and further insures that the transistor areas will be subjected to substantially the same dopant environment during the diffusion processes required to form the transistors.

DETAILED DESCRIPTION OF THE INVENTION

Figure 1:
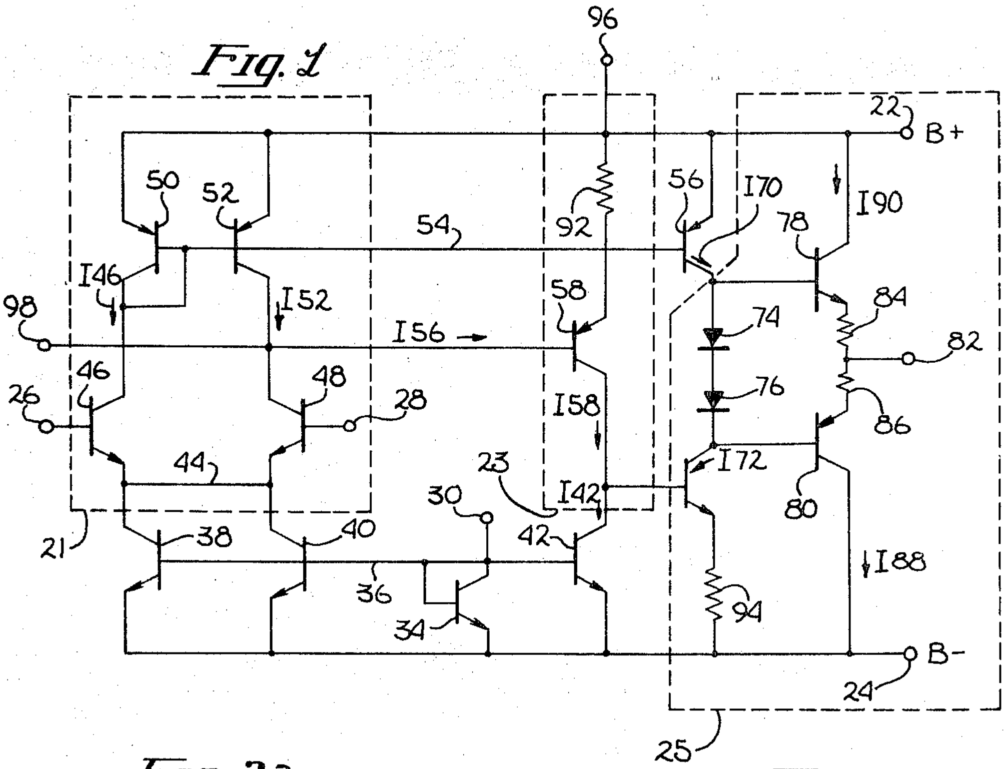
FIG. 1 is the circuit of the preferred embodiment of the present invention.
Figure 2A:
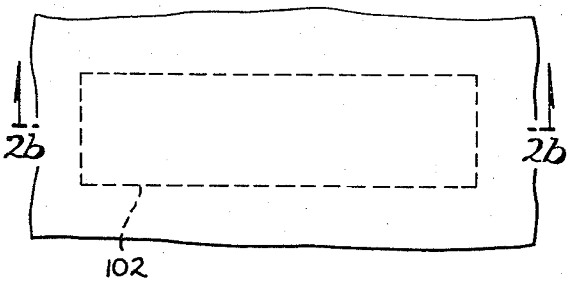
FIG. 2*a* is the top view of a section of a substrate having a buried layer therein.
Figure 2B:
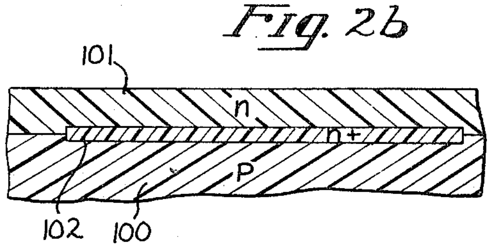
FIG. 2*b* is a cross-section of the substrate of FIG. 2*a* taken along lines 2*b* — 2*b* of that figure.

First referring to FIG. 1, the circuit of the present invention operational amplifier may be seen. In this circuit, terminal 22 is intended for connection to the positive side and terminal 24 to the negative side of a power supply. Terminals 26 and 28 are the differential input terminals to the amplifier, terminal 26 being the inverting input terminal and terminal 28 being the non-inverting input terminal. Terminal 30 is the external bias current terminal and is for connection through a resistor to the positive side of the power supply to which terminal 22 is connected. Also, for ease of reference, the stages of the amplifier have been enclosed within dusked lines, the differential, input stage being with region 21, the coupling stage within region 23 and the output stage within region 25, with the bias current determining resistors being shown external to the differential input, coupling and output stages.

The emitter of transistor 34 is connected to the negative terminal 24 and the base and collector of transistor 34 are connected together so that transistor 34 acts as a diode. Application of a bias current through an external bias resistor connected to terminal 30 determines the voltage drop across transistor 34 by determining the operating point on the diode curve for the common base collector connection of transistor 34. In this regard, it should be noted that most of the current applied through terminal 30 flows through the collector of transistor 34 since, in general, the base current will be only a small portion of the collector current because of the gain of the transistor.

In general, transistors 38, 40, 34 and 42 will be matched transistors. Therefore, since the voltage drop between line 36 and terminal 24 is the voltage between the base and the emitter of each of these transistors, and in general the collector current of a transistor is dependent primarily on the base to emitter voltage, the transistors 38, 40 and 42 will have substantially the same collector current as was set in transistor 34 through bias terminal 30. Thus the bias currents in the differential input stage and the coupling stage are determined by the current in transistor 34.

The collectors of transistors 38 and 40 are connected together through lines 44 so that though the current in transistors 38 and 40 will be substantially equal, the current through transistors 46 and 48 may be unequal. (As an alternate, transistors 38 and 40 may be replaced with a single transistor, with twice the base-emitter junction area as transistor 34. The emitter of transistor 50 is connected to terminal 22 and the base and collector of the transistor are connected together so that transistor 50 acts as a diode, as hereinbefore described for transistor 34. Thus, the voltage on lines 54, which is the emitter to base voltage of transistor 50, is determined by the diode characteristic curve for transistor 50 and the current flowing through that transistor. Therefore, as before, since the current through a transistor is primarily dependent upon the emitter to base voltage (assuming proper collector biasing) the current through each of transistors 52 and 56 in substantially the same as the current through transistor 50, and is determined by the bias current applied at terminal 30 and by the differential signal applied to terminals 26 and 28. Thus the current in transistor 56, which in the bias current in the output stage, is also determined by the bias current applied to terminal 30.

When the input current at terminal 26 is the same as the input current at terminal 28, the current flow through transistor 46 will be the same as the current through transistor 48, and the voltages at terminals 26 and 28 will be substantially equal. When the current applied at terminal 26 is higher than the current applied at terminal 28 (thereby indicating a higher voltage on terminal 26 than on terminal 28) the current through the two transistors will redistribute so that the current I46 will be higher than the current I48 by an amount equal to $\beta_1$ times the difference in input current between terminals 26 and 28, where $\beta_1$ equals the beta of the transistors 46 and 48 (it should be noted that I46 plus I48 will still be substanially equal to twice the bias current applied at terminal 30 because of the biasing at the bases of transistors 38 and 40 through transistor 34).

As hereinbefore described, the current through transistor 50 sets a substantially equal current in each of transistors 52 and 56. Consequently, the current I52 will also be increased by an amount equal to $\beta_1$ times the difference in current applied at terminals 26 and 28. Since the current I48 decreased by the same amount, the current I56, which is the base current to transistor 58, must increase by an amount equal to $2\beta_1$ times the difference in input current. Similarly, if the current input at terminal 28 exceeds the current input at terminal 26, the current I56 will decrease by an amount equal to $2\beta_1$ times the difference in input current. Thus, the current gain for the differential input stage comprising transistors 46, 48, 50 and 52 is equal to $2\beta_1$. This is to be compared with a gain of typical differential input stages using passive loading, that is, resistors in place of transistors 50 and 52, of something substantially less than $\beta$.

The current applied at the bias terminal 30 sets the current I42 through transistor 42 as previously described. Therefore, the current I60 applied to the base of transistor 60 will be the difference between the bias current I42 and the current I58 through transistor 58. Consequently, the change in the current I60 with the change in current I56 will be $-\beta_2$ times the change in I56, where $\beta_2$ is the gain of transistor 58. (The minus sign arises because of the signal inversion caused by transistor 58.)

The current I70 in transistor 56 is substantially equal to the current I46 in transistor 50, as previously described. The current I72 in transistor 60 depends on the base current of the transistor and will change with changes in I60 by an amount equal to $\beta_3$ times the change in the current I60, where $\beta_3$ is the gain of transistor 60. Diodes 74 and 76 are in series with transistors 56 and 60 for the purpose of substantially matching the base to emitter voltage drop in transistor 78 and the emitter to base voltage drop in transistor 80. Consequently, when the current I72 in transistor 60 is equal to the current I70 in transistor 56, most of that current will flow through diodes 74 and 76. Therefore, both transistors 78 and 80 will be substantially turned off so that the output is at terminal 82 will be zero and the power dissipation in resistors 84 and 86 will be a minimum. This creates two diode voltage drops which are equal to the base emitter voltages in transistors 78 and 80. Therefore, the current which flows through 74 and 76 will create a current through transistors 78 and 80 of the same magnitude. When the current I72 in transistor 60 is increased over the current I70 in transistor 56, the difference in current I72 minus I70 will come primarily from the base of transistor 80, thereby causing a current flow I88 substantially equal to $\beta_4$ times I72 minus I70, where $\beta_4$ is the gain of transistors 78 and 80. Since the current in transistor 78 at this time will be very low, the current I88 will come from the load applied at terminal 82 through resistor 86 thereby causing the output voltage at terminal 82 to swing negative under these conditions by an amount dependent upon the load applied to terminal 82. Similarly, when the current I72 is decreased below I70, the difference in these two currents flows primarily into the base of transistor 78, thereby causing a current I90 equal to $\beta_4$ times the base current in that transistor. The emitter current in transistor 78 flows through resistor 84 and since transistor 80 will be substantially off at this time, the current through resistor 84 flows through output terminal 82 and the load connected thereto, thereby causing a positive output voltage depending upon the load across to the output terminals.

The current I70 is substantially equal to the current I46 in transistor 50, which in turn is the current through transistor 46. Consequently, not only does the current I72 in transistor 60 vary with the change in the input signal, but the current I70 also changes in response to a change in the input. This might be illustrated as follows: When the voltage applied at terminal 26 is increased above the voltage applied to terminal 28 (the current into terminal 26 thereby being increased above the current applied to terminal 28) the current I46 and, therefore, the current I70 will increase with a gain equal to $\beta_1$. At the same time the current I72 will decrease with a gain of $-2\beta_1\beta_2\beta_3$. Therefore, the net gain up to the output stage comprising transistors 78 and 80 is approximately $\beta_1[2\beta_2\beta_3 + 1]$.

In the integrated circuit embodiment of the present invention, transistor 58 is a lateral PNP transistor and, therefore, has a relatively low beta, typically ranging from 3 to 10. Consequently resistor 92, which in the preferred embodiment has a value of approximately 5000 ohms, reflects back to the base of transistor 58 at a resistance ranging from 15,000 to 50,000 ohms, depending upon the beta of transistor 58. This is to be compared with the base impedance of the coupling transistors in other prior art active load amplifiers, which typically is in the megohm region. The low base impedance of transistor 58 is important in achieving a wide bandwidth in the amplifier, since this resistance in combination with the stray capacitance in the circuit gives rise to an RC time constant which limits the bandwidth of the circuit. Transistor 60 is designed to have a beta ranging from 30 to 50 and, therefore, resistor 94, which also has a value of 5000 ohms, reflects back to the base of transistor 60 as an impedance of 150 to 250 thousand ohms. While this impedance is substantially higher than the base impedance of coupling transistor 58, it is still substantially lower than the base impedance characteristic of prior art active load amplifiers. Also, since resistors 84 and 86 are each approximately 250 ohms, these resistors reflect back to the bases of transistor 78 and 80 respectively to also give a relatively low value of base impedance. Consequently, a relatively wide bandwidth is achieved by minimizing the impedance level of the various stages of the present invention amplifier, but not at the sacrifice of either gain or power consumption.

As in prior art amplifiers, phase compensation is required to achieve stable operation of the amplifier of FIG. 1, since otherwise the circuit will oscillate at a relatively high frequency. The phase compensation may be achieved by placing a 2000 picofarad capacitor in series with 1000 ohm resistor between terminal 98 and ground, or by connecting a 2000 picofarad capacitor between output terminal 82 and terminal 96.

In order for the common mode rejection of the amplifier to be as high as possible, it is important that certain transistors in the circuit of FIG. 1 be matched transistors. By way of example, transistors 50 and 52 should have as nearly identical electrical characteristics as possible. In the preferred embodiment of the present invention, a new and unique configuration comprising these two transistors and also transistor 56 has been employed. It will be noted that these three transistors have a common base connection through line 54, and therefore may be formed with a common base element so that no further base interconnection is required. By doing this, the transistors may be physically located on the substrate as close together as possible. This aids in obtaining matched operating characteristics for the transistors by preventing substantial temperature differences in the transistors, both during processing and during operation, and by assuring the same dopant environment for all three transistor areas during the diffusion processes in fabricating the devices.

The construction of these three transistors in the preferred embodiment is shown in FIGS. 2*a* and 2*b* through 7*a* and 7*b* which are top view and cross-sections of the substrate at various stages in the fabrication of the integrated circuit. First referring to FIGS. 2*a* and 2*b*, a composite substrate having an N+ buried layer 102 may be seen. The buried layer 102 is created by diffusing a suitable dopant into the surface of a P type silicon substrate 100 to create the N+ layer, and thereafter growing an epitaxial layer of N type silicon 101 over the surface of the substrate so as to bury the N+ region 102 beneath the surface of the resulting substrate.

Figure 3A:
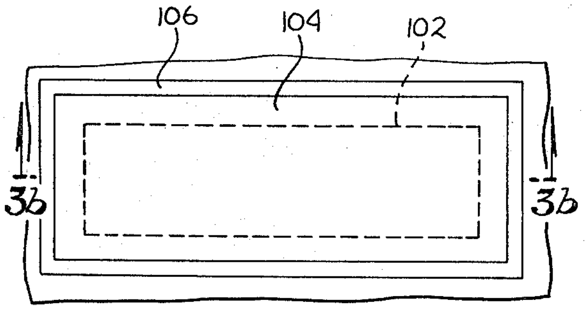
FIG. 3*a* is a top view of the substrate of FIG. 2*a* with an isolation region diffused through the substrate.
Figure 3B:
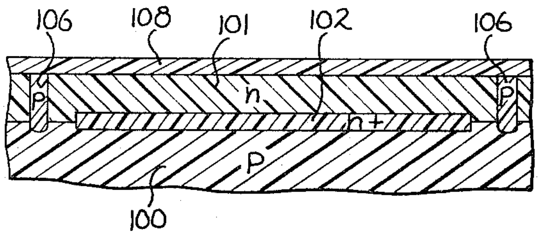
FIG. 3*b* is a cross-section of the substrate of FIG. 3*a* taken along lines 3*b* — 3*b* of that figure.

The next step in the processing is to electrically isolate an area 104 of the substrate 100 from the remainder of the substrate by doping an area of the substrate to create a P type region 106 surrounding the area 104. The region 106 extends all the way through the thickness of the eiptaxial layer 101 and is created by conventional diffusion techniques by first providing a layer of silicon oxide on the substrate, etching a pattern in the silicon oxide to expose the surface of the substrate in which the P type dopant is to be diffused, diffusing in a suitable P type dopant (boron) and finally providing a new oxide layer over the P region 103. (In the preferred embodiment, the P region is only diffused partially through the substrate at this stage, with additional diffusion to complete the isolation occurring simultaneously with subsequent diffusion steps.) Thus, as shown in FIG. 3*b*, an oxide layer 108 covers the substrate after the P region 106 has been created. By applying a negative voltage to the P regions 101 (and 106), the P-N junction between P region 106 and the surrounding substrate on both sides of the P region is backed biased, thereby electrically isolating region 104 from the rest of the substrate.

Figures 4A, 4B:
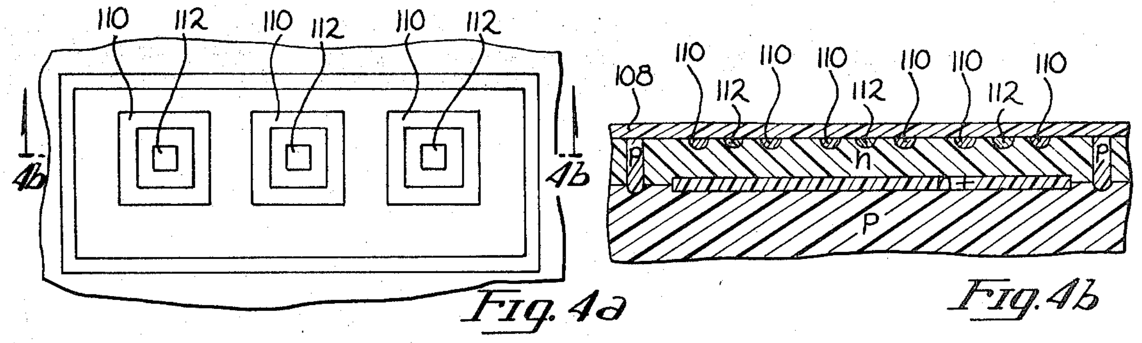
FIG. 4*a* is a top view of the substrate of FIG. 3*a* after emitter and collector regions have been diffused into the substrate.
FIG. 4*b* is a cross-section of the substrate of FIG. 4*a* taken along lines 4*b* — 4*b* of that figure.

The next step in the processing is to etch a pattern in the oxide layer 108 to expose portions of area 104, to diffuse in a P type diffusant to create P regions 110 and 112, and to thereafter provide an oxide layer over the P regions so that the substrate is again entirely covered with the oxide layer 108 as shown in FIGS. 4*a* and 4*b*. The P regions 110 are the collectors of transistors 50, 52 and 56, and the P regions 112 are the emitters for these transistors. The bases for these transistors are formed by the area 104 of the substrate which forms a common base region for all the transistors.

Figure 5A:
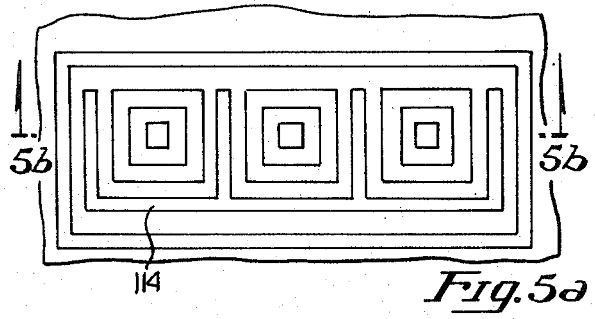
FIG. 5*a* is a top view of the substrate of FIG. 4*a* after a region of increased conductivity, for electrical contact purposes, has been diffused into the substrate.
Figure 5B:
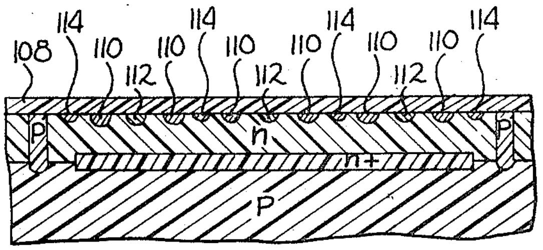
FIG. 5*b* is a cross-section of the substrate of FIG. 5*a* taken along lines 5*b* — 5*b* of that figure.

The next step in the processing is to again etch a pattern in the oxide layer 108 to expose a portion of the substrate in area 104, to diffuse an N type dopant into the exposed area of the substrate, and to again create an oxide layer over the exposed area of the substrate to replenish oxide layer 108 as shown in FIGS. 5*a* and 5*b*. This creates an N+ region 114, that is, a region having increased conductivity (for purposes of making electrical contact to the common base region of the three transistors as shall be subsequently described) which symmetrically surrounds the collector regions 110 of the three transistors.

Figure 6A:
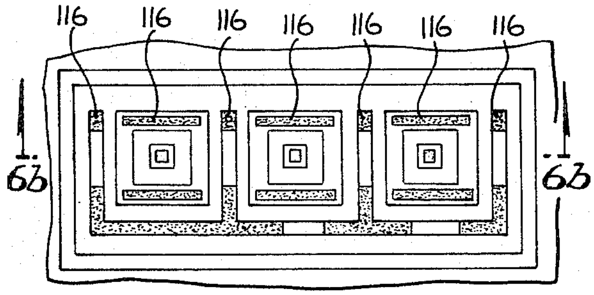
FIG. 6*a* is a top view of the substrate of FIG. 5*a* after a plurality of windows have been etched in the oxide layer covering the substrate.
Figure 6B:
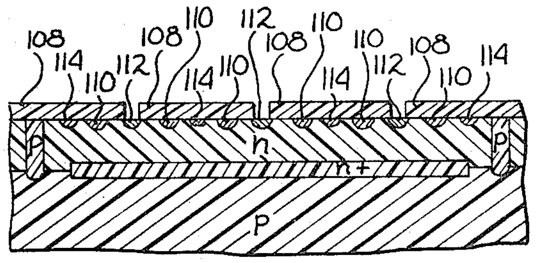
FIG. 6*b* is a cross-section of the substrate of FIG. 6*a* taken along lines 6*b* — 6*b* of that figure.
Figure 7A:
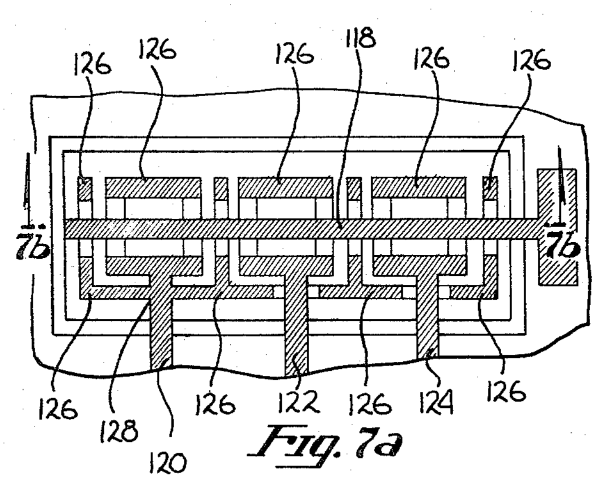
FIG. 7*a* is a top view of the substrate of FIG. 6*a* after a metalized pattern has been deposited on the surface of the substrate.
Figure 7B:
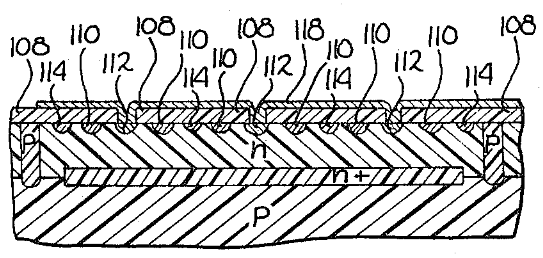
FIG. 7*b* is a cross-section of the substrate of FIG. 7*a* taken along lines 7*b* — 7*b* of that figure.

The next step in the processing is to again etch a pattern in the oxide layer 108 as shown in FIGS. 6*a* and 6*b* to expose portions of the N+ region 114 and P regions 110 and 112. These various regions are exposed in substantially symmetrical patterns so as to preserve the physical equivalence and electrical similarity in characteristics of the three transistors to the greatest extent possible.

The final step in the processing is to create a metalized pattern over the surface of the device of FIGS. 6*a* and 6*b* to provide the desired electrical contact with the various regions and to provide circuit interconnections to other components in the integrated circuit. As in the other processing steps to create the three PNP transistors having a common base region, the processing steps for creating such a metalized pattern are also well known in the prior art, and generally are comprised of the steps of depositing a surface layer of metal and then etching away the metal in selected regions so as to leave a metal pattern as desired. The metal region 118 contacts the exposed areas 116 of the P regions 112 forming the emitters for the three transistors and, thus, provides a common emitter connection as is used in the circuit of FIG. 1. Metalized regions 120, 122 and 124 provide contacts to each of the P regions 110 forming the collectors of the three transistors. Metalized regions 126 generally form the contact to the common base region of the three transistors and are disposed in a symmetrical pattern, again to maintain the mechanical and electrical similarity between the three transistors. It should be noted that in the region generally indicated by the numeral 128, the metalized region 120 forming the collector contact for the first transistor is integral with metal region 126, thereby electrically connecting the base and the collector of this first transistor. This connection forms the base to collector connection of transistor 50 in FIG. 1. It is to be understood, however, that other interconnections may be made by altering the metalized pattern and by making other obvious changes in the layout and processing in the fabrication of the devices, the specific interconnection shown in FIGS. 7*a* and 7*b* being the interconnection used in the preferred embodiment to fabricate one specific operational amplifier, that is, the amplifier of FIG. 1.

The preferred embodiment circuit of the present invention amplifier is the circuit of FIG. 1. However, it is to be understood that as an alternate embodiment of the present invention, the circuit of FIG. 1 may be altered by changing each and every PNP transistor to an NPN transistor changing each and every NPN transistor to a PNP transistor, reversing the orientation of diodes 74 and 76, and by making terminal 22 the negative terminal and terminal 24 the positive terminal.

Amplifiers fabricated in accordance with the teachings of the present invention have exhibited performance capabilities heretofore not achievable with the prior art amplifiers. These amplifiers have been operated from power supplies of ± 1 volt (2 volts between terminal 22 and terminal 24 in FIG. 1) with a power dissipation of approximately 60 microwatts. The amplifiers characteristically have an open loop gain ranging from 66 DB to 76 DB with a typical input offset of 2.5 milivolts. The same amplifiers, however, by changing the supply voltage and by changing the bias current in the various amplifier stages through the external resistor connected between terminal 30 and terminal 22, may be used as amplifiers having an output voltage swing of several volts and an output power of several miliwatts.

Thus, there has been described an operational amplifier having a wide bandwidth and improved stability, and which may be adapted for various power supply voltages and output requirements by the appropriate selection of an external bias resistor.

While the invention has been particularly shown and described with reference to a preferred embodiment thereof, it will be understood by those skilled in the art that various changes in form and details may be made therein without departing from the spirit and scope of the invention.

I claim:

1. A transistor amplifier having first and second input terminals, first and second power supply terminals, an output terminal, a bias terminal, first, second, thrid, fourth, fifth, sixth and seventh transistors of a first conductivity type, eighth, ninth, tenth, eleventh and twelfth transistors of a second conductivity type, each of said transistors of said first and second conductivity types having an emitter, a base and a collector; first and second diode means, and first, second, third and fourth resistors, wherein said first and second input terminals are coupled to said bases of said first and second transistors respectively, said emitter of said first and second transistors are coupled together and to said collector of said third transistor, said emitter of said third transistor is coupled to said first power supply terminal, said base of said third transistor is coupled to said bias terminal, to said base and said collector of said fourth transistor, and to said base of said fifth transistor, said emitters of said fourth and fifth transistors are coupled to said first power supply terminal, said collectors of said first and second transistors are coupled to said collectors of said eighth and ninth transistors respectively, said emitters of said eighth and ninth transistors are coupled to said second power supply terminal, said collector of said eighth transistor is coupled to said bases of said eighth, ninth and tenth transistors, said emitter of said tenth transistor is coupled to said second power supply terminal, said collector of said tenth transistor is coupled through said first and second diodes to said collector of said sixth transistor, said emitter of said sixth transistor is coupled through said first resistor to said first power supply terminal, said base of said sixth transistor is coupled to said collectors of said fifth and eleventh transistors, said base of said eleventh transistor is coupled to said collector of said second transistor, said emitter of said eleventh transistor is coupled to said second power supply terminal through said second resistor, said collector of said seventh transistor is coupled to said second power supply terminal, said base of said seventh transistor is coupled to said collector of said tenth transistor, said emitter of said seventh transistor is coupled through said third resistor to said output terminal, said output terminal also being coupled through said fourth resistor to said emitter of said twelfth transistor, said base of said twelfth transistor is coupled to said collector of said sixth transistor, and said collector of said twelfth transistor is coupled to said first power supply terminal.

2. The amplifier of claim 1 wherein said first and second resistors each have a resistance of approximately 5000 ohms.

3. The amplifier of claim 1 wherein said third and fourth resistors each have a resistance of approximately 250 ohms.

4. The amplifier of claim 1 further comprised of a thirteenth transistor of a first conductivity type, having an emitter, a base and a collector, wherein said emitter, said base and said collector of said thirteenth transistor is coupled to said emitter, said base and said collector of said third transistor, respectively.

5. The amplifier of claim 1 wherein said transistors of a first conductivity type are NPN transistors, said transistors of a second conductivity type are PNP transistors and said first and second power supply tenminals are the negative and positive power supply terminals, respectively.

6. The amplifier of claim 5 wherein said amplifier is an integrated circuit amplifier formed in an N conductivity type silicon chip and said bases of said eighth, ninth and tenth PNP transistors have a common base region formed by a portion of said N type chip.

7. A differential input amplifier comprising first and second transistors of a first conductivity type, third, fourth and fifth transistors of a second conductivity type, a bias current determining means, an output amplifier and a coupling means, each of said transistors having an emitter, a base and a collector, the bases of said first and second transistors each being coupled to one of two differential input connections, the emitters of said first and second transistors being coupled together and through said bias current determining means to a first power supply terminal, said collector of said first transistor being coupled to said collector and said base of said third transistor, and to said base of said fourth transistor, said collector of said second transistor being coupled to said collector of said fourth transistOr and to an output connection of said differential input stage, said emitters of said third and fourth transistors being coupled to a second power supply terminal, said output amplifier having an input connection, a bias current connection and an output terminal and being a means for presenting an output signal at said output terminal responsive to the currents applied to said input connection and said bias current connection, said fifth transistor having its collector coupled to said bias current connection, its emitter coupled to said second power supply terminal and its base coupled to said bases of said third and fourth transistors; said coupling means being cOupled between said collector of said second transistor and said input connection of said output amplifier and being a means for coupling a signal to said input connection which is responsive to the difference in current in said collector of said fourth transistor and said collector of said second transistor.

8. The operational amplifier of claim 7 further comprised of a sixth transistor of a first conductivity type and a bias current determining means, and wherein said coupling means is comprised of seventh transistor of a second conductivity type and a resistor, each of said transistors having an emitter, a base and a collector, said seventh transistor having its emitter coupled to said second power supply terminal through said resistor, its said base coupled to said collector of said second transistor and its said collector coupled to said collector of said sixth transistor and to said input connection of said output stage, said sixth transistor having its emitter coupled to said first power supply terminal and its base coupled to said bias current determining means, said bias current determining means being a means for controlling the current in said sixth transistor.

9. The operational amplifier of claim 8 wherein said bias current determining means is comprised of an eighth transistor of a first conductivity type having an emitter, a base and a collector, said eighth transistor having its emitter coupled to said first power supply terminal and its base and collector coupled to a bias current input terminal and to said base of said sixth transistor.

10. The operational amplifier of claim 9 wherein said transistors of a first conductivity type are NPN transistors, said transistors of a second conductivity type are PNP transistors and said first and second power supply terminals are the negative and positive power supply terminals respectively.

* * * * *